United States Patent
Giacri et al.

(10) Patent No.: US 6,761,772 B2
(45) Date of Patent: Jul. 13, 2004

(54) WORKPIECE SUPPORT

(75) Inventors: Laurent Giacri, Saint-Chamond (FR); Anton Kunz, Triesenberg (LI)

(73) Assignee: Unaxis Balzers Aktiengesellschaft, Furstentum (LI)

(*) Notice: Subject to any disclaimer, the term of this patent is extended or adjusted under 35 U.S.C. 154(b) by 155 days.

(21) Appl. No.: 10/141,432

(22) Filed: May 8, 2002

(65) Prior Publication Data

US 2003/0015136 A1 Jan. 23, 2003

(30) Foreign Application Priority Data

May 8, 2001 (CH) ............................................. 0830/01

(51) Int. Cl.[7] .......................... H01L 21/00; C23C 16/00
(52) U.S. Cl. ............. 118/730; 156/345.55; 204/298.27; 204/298.28
(58) Field of Search ..................... 118/730; 156/345.55; 204/298.27, 298.28

(56) References Cited

FOREIGN PATENT DOCUMENTS

| DE | 19803278 | 8/1999 |
|---|---|---|
| WO | WO 00/36178 | 6/2000 |

Primary Examiner—Gregory Mills
Assistant Examiner—Ram N Kackar
(74) Attorney, Agent, or Firm—Needle & Rosenberg, PC.

(57) ABSTRACT

In order to ensure uniform coating of workpieces, workpiece holders carrying said workpieces are rotatably mounted at the edge of a turntable, a plurality of which are fastened in succession at adjustable distances to a drivable shaft. In order to trigger intermittent rotations of the workpiece holders, a driver finger of a driving device engages in each case a drive wheel thereof on each revolution of the turntable, so that the workpiece holders are rotated relative to the turntable through a specific angle in a direction opposite to the direction of rotation of said turntable. In order that no readjustment of the driver finger is required, for example in the case of a change of distances between the turntables, said driver finger is fastened to an extension of a rotating ring, which is mounted on the turntable itself so as to be non-displaceable in the direction of the shaft but rotatable about said shaft. The extension cooperates with a rod serving as a stop, in such a way that rotation of the driving device together with the turntable is prevented.

16 Claims, 1 Drawing Sheet

WORKPIECE SUPPORT

This application claims priority to the Switzerland Patent Application No. 0830/01, filed May 8, 2001, which application is hereby incorporated in its entirety.

BACKGROUND OF THE INVENTION

1. Field of the Invention

The invention relates to a workpiece support for a coating unit, in particular a workpiece support for use in a vacuum coating unit. A workpiece support of this type usually carries a relatively large number of workpieces, in a manner such that, in order to ensure uniform coating, they move past coating sources, in a composite movement produced, for example, by superposition of a plurality of elemental movements, generally circular movements, and simultaneously rotate.

2. Prior Art

Workpiece supports in which the drivers are each mounted on a rod parallel to the shaft and passing through adjacent to the turntables are known. This has the disadvantage that, if the distances between the turntables are changed for adaptation to the length of the workpieces, the drivers must be correspondingly displaced and have to be readjusted, which entails considerable effort and in particular requires several test runs. If a turntable is changed, the driver too has to be changed or at least readjusted. An incorrect adjustment can have serious consequences.

A solution similar in design to the known solution of the generic type, in which, however, the possibility of changing the distances between the turntables or of replacing turntables is not provided, is described, for example in DE-A-198 03 278. WO-A-00/36 178 describes, inter alia, a workpiece support of the generic type, in which a driver is coordinated with each turntable and is rotatably supported on the upper surface of said turntable. However, the driver is not firmly connected to the turntable, so that, as a rule, it has to be remounted and readjusted in the case of changes to the workpiece support.

SUMMARY OF THE INVENTION

It is the object of the invention to provide a workpiece support of the generic type, in which adaptations to the respective workpiece geometries and to other requirements with respect to the coating process, for example by changes of the distances between the turntables or by replacement of the turntables, are possible readily and without considerable effort.

The present invention is directed to a workpiece support unit for a coating unit. In one embodiment, the workpiece support unit has at least one drivable shaft rotatable about a main axis of rotation, a plurality of turntables that are non-rotatably connected to the shaft, at least one workpiece holder, a plurality of driving devices, and a stop. Each driving device is mounted to one respective turntable so as to be rotatable about the main axis of rotation and to be non-displaceable in the axial direction of the shaft. Each driving device includes a driver that is coordinated with the turntable so that it engages at least intermittently with at least one workpiece holder, which is rotatably mounted onto the turntable, to cause the workpiece holder to rotate about its axis of rotation. Finally, the stop cooperates with a portion of each driving device to limit the rotation of the driving device.

The advantages achieved by the invention are in particular that the respective driver need be adjusted only once. In particular, changes to the distances between the turntables or the replacement of individual turntables do not necessitate any readjustment. Even the single adjustment can be carried out on the individual turntable without other components of the unit having to be included. Turntables formed according to the invention can generally readily be integrated into existing coating units.

The invention permits assembly of the workpiece support from individual building blocks, in particular from turntables forming in each case a compact and robust unit, which can be assembled according to the modular principle and, apart from the force-transmitting shaft/turntable fit and a similar external diameter of the turntables, need not be particularly tailored to one another. For example, the turntables can thus be formed differently without requiring adaptations of other parts of the unit.

In particular, turntables of different designs can simultaneously be used on one and the same workpiece support. They can be provided with different pitches, i.e. different numbers of workpiece holders, for example in adaptation to the respective workpiece geometry or can be formed in adaptation to specific requirements relating to the coating of the workpieces arranged on them, for example for intermittent or continuous rotation of the workpiece. It is also possible for turntables formed according to the invention and those formed conventionally to be combined in a workpiece support.

In any case, the driving device can be mounted completely or predominantly outside the trajectory of the workpiece and the driver can engage with the workpiece holders from the edge of the turntable so that components interfering with the coating process and overlapping the workpieces are not required. At the same time, however, the driving device can be compactly formed and arranged so that turntables formed according to the invention have the same or only a slightly larger height in comparison with conventional turntables.

BRIEF DESCRIPTION OF THE DRAWINGS

The invention is explained in more detail below with reference to the Figures, which show only an embodiment.

DETAILED DESCRIPTION OF THE INVENTION

The present invention is more particularly described in the following examples that are intended to be illustrative only since numerous modifications and variations therein will be apparent to those skilled in the art. As used in the specification and in the claims, the singular form "a," "an," and "the" may include plural referents unless the context clearly dictates otherwise.

Figure 2:
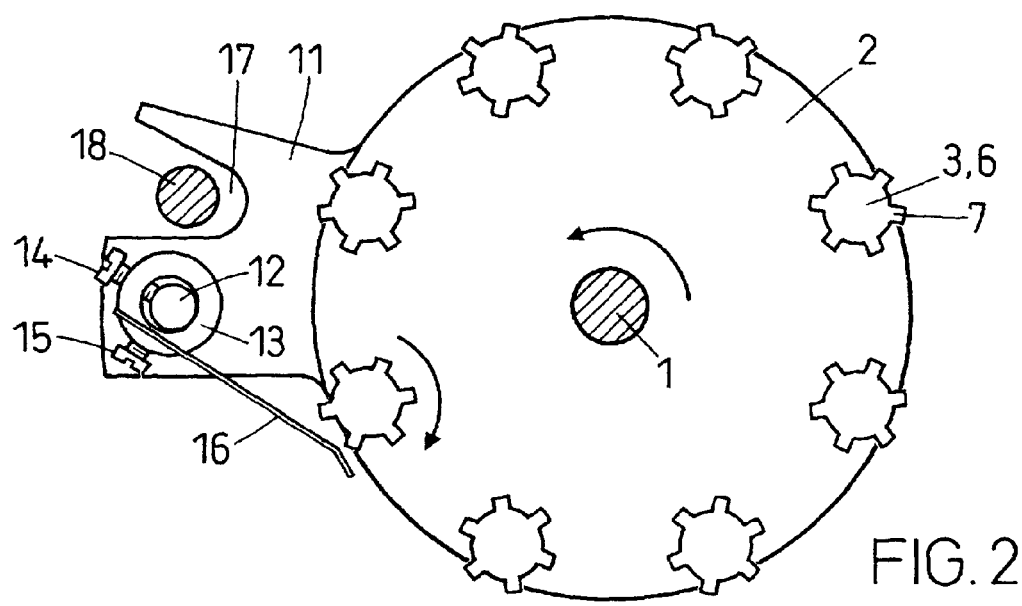
FIG. 2 shows a plan view of the workpiece support of FIG. 1.

A vertical shaft 1 which can be driven so that it executes one revolution according to the arrow in FIG. 2 about a main axis of rotation coinciding with its axis is rotatably mounted in a base (not shown) which can be arranged in a stationary or movable manner, for example rotatably, in a vacuum chamber. Nonrotatably fastened to the shaft 1, in succession a distance apart, are turntables 2 which in each case carry, close to the edge, a plurality of workpiece holders 3 which are an identical distance away from the shaft 1 and in each case are mounted on the turntable 2 by means of an axle journal 4 so as to be rotatable about an axis of rotation which is parallel to the main axis of rotation. In order to save weight and material, but also to permit as uniform coverage as possible of the workpieces by plasma or unhindered particle bombardment, the turntables can also be of a lightweight design, for example in the form of a spoked turntable.

Figure 1:
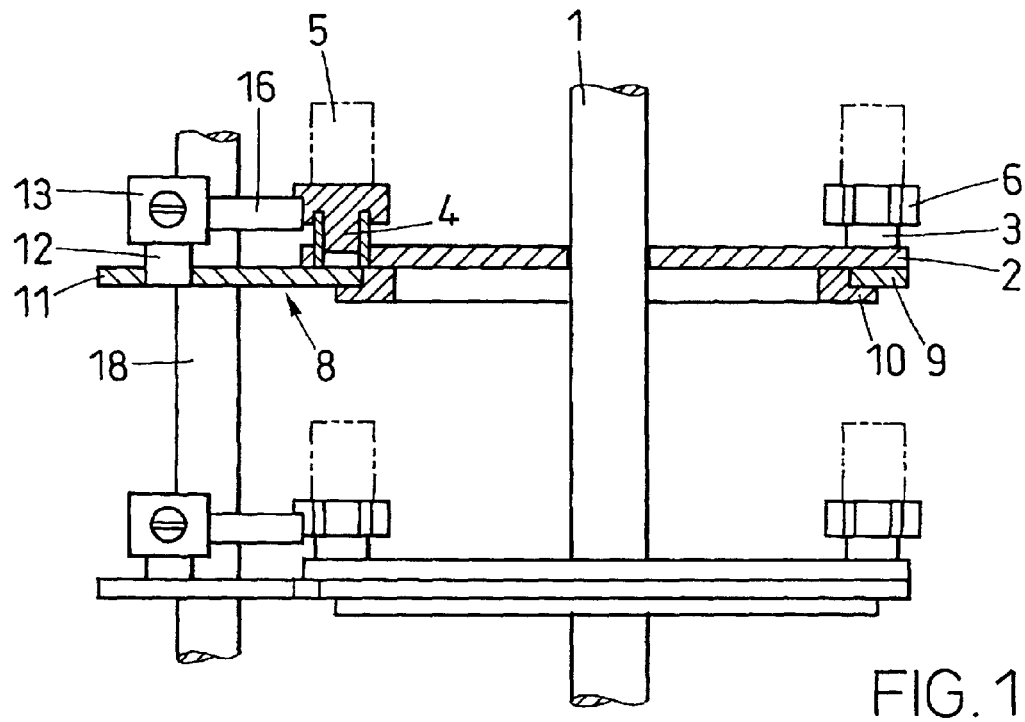
FIG. 1 shows a partly cut-away side view of a part of a workpiece support according to the invention.

The workpiece holders 3 are distributed uniformly over the circumference of the respective turntable 2 so that they form a regular polygon, in the case shown an octagon, in the centre of which the main axis of rotation is located. During use, each of the workpiece holders 3 carries a workpiece 5 (FIG. 1, dash-dot line). The distances between successive turntables 2 can be changed in adaptation to the length of the workpieces. Where the shaft 1 has a circular profile, the turntables 2 can be fastened to the shaft 1, for example, by slot/lug fitting means or similarly simple fitting means or by detachable screw connections, for example by clamping screws. In the case of other shaft profiles, additional measures for fastening the turntable to the shaft are generally unnecessary. For fixing the positions of the turntables 2, it is possible to use spacers, for example sleeves which are not shown here, are pushed onto the shaft and in each case sit on a projection running around the lower end of the shaft or on one of the turntables 2.

Each of the workpiece holders 3 has a drive wheel 6 which is arranged at the upper end of the axle journal 4, is coaxial with its axis of rotation and has teeth 7 which are distributed regularly over the circumference, project outward and can be separated by spaces, as in the example.

Also mounted on the turntable 2 is a driving device 8 which comprises a rotating ring 9 which is coaxial with the shaft 1 and is held by a ring retainer 10, fastened inside said rotating ring to the underside of the turntable 2 and gripping the rotating ring 9 from below with a ledge running around the outside, in such a way that it is prevented from moving parallel to the main axis of rotation but is rotatable about said axis. Furthermore, the driving device 8 has an extension 11 which projects outward from the rotating ring 9 and carries a peg 12 which points upwards parallel to the shaft 1 and to which a fastening ring 13 is fastened by means of a fastening screw 14. A driver in the form of a driver finger 16 directed towards the edge of the turntable 2 is held in a slot in the fastening ring 13 so as to be longitudinally displaceable but fixed by a setscrew 15. The fastening screw 14 and the setscrew 15 are clamping screws, and the driver finger 16 is a strip of spring steel.

The position of the driver finger 16 can be adjusted in several respects. After the fastening screw 14 has been slackened, the fastening ring 13 can be pushed along the peg 12, i.e., parallel to the shaft 1, and rotated in the plane normal thereto. Its effective length can be adjusted by longitudinal displacement after slackening of the setscrew 15. In addition to the peg 12, the extension 11 has a recess 17 that comes in the form of a bay from the outside and through which a rod 18 anchored to the base and parallel to the shaft 1 projects. It serves as a stop which engages the driving devices 8 of all turntables 2 mounted on the shaft 1, in such a way that they are fixed with respect to their angular position and are prevented from rotating with the respective turntable 2.

On rotation of the shaft 1 and of the turntable 2 fastened to it about the main axis of rotation, each of the workpiece holders 3, following their circular trajectory comes into contact once with the driver finger 16 during each revolution. Said driver finger temporarily engages one of the teeth 7 on the drive wheel 6 and thus causes the corresponding workpiece holder 3 to rotate in the direction opposite to that of the turntable 2, relative to the turntable 2, in such a way that, at the end of the engagement, the next tooth in the direction of rotation of the turntable 2 substantially assumes the position which the first-mentioned tooth had assumed before the engagement. Relative to the turntable 2, the workpiece holder 3 is thus rotated through the engagement of the driver finger 16 with the drive wheel 6 by the angular difference between two successive teeth—in the example 60°—in a direction opposite to the direction of rotation of the turntable 2. Since the driver is connected only to the turntable 2, the adjustment thereof can be effected on the isolated turntable, independently of other parts of the unit. Removal and reinstallation thereof, for example for changing the spacing of the turntables 2 arranged vertically in succession along the shaft 1, require no readjustment of the driver.

The driving device can be formed in a manner other than that described in the case of all turntables, but also in the case of individual turntables. Thus, the extension need not have any recess, since a stop, which is effective on one side against the direction of rotation of the turntable, is sufficient. The drive wheels can each have a continuous tooth system or can be in the form of Maltese crosses or friction wheels that may be of different designs. Instead of being in the form of a driver finger, the driver can be in the form of a driver ring which follows the edge of the turntable and has an tooth system at the inside, preferably—since it is particularly easy to produce in this case—in the form of a cylindrical metal sheet having a tooth profile, the tooth system engaging the tooth systems of the drive wheels so that the workpiece holders are rotated continuously instead of intermittently.

Particularly on turntables having continuously rotating workpiece holders, a predefined breaking point is preferably provided, which prevents major damage to a turntable in the event of jamming of the driving device or of a workpiece holder. This can be effected in such a way that the extension has a point of reduced cross-section at which it breaks when a specific torque is exceeded and allows the turntable to rotate while at the same time indicating the malfunction thereof. A similar effect can be achieved by making the extension springy or fastening it by means of a joint. Alternatively or in addition, it is possible to provide predetermined breaking points at the shaft/turntable fit and at the drive wheels or axle journals of the workpiece holders. The latter may be designed as economical disposable parts.

With the use of a joint, it is possible to design a predetermined breaking point by securing said joint by means of a wire, in particular a copper wire having a defined shear strength, so that said joint executes a folding movement when the breaking load thereof is exceeded. In this case, a broken predetermined breaking point can easily be repaired on site without great effort by the operator of the coating unit. Predetermined breaking points can also be provided in a similar manner on other force-transmitting parts, such as, for example, drive wheels, by producing said predetermined breaking points from two or more components which are connected by wires of defined shear strength.

Although the illustrative embodiments of the present disclosure have been described herein with reference to the accompanying drawings, it is to be understood that the disclosure is not limited to those precise embodiment, and the various other changes and modifications may be affected therein by one skilled in the art without departing from the scope of spirt of the disclosure. All such changes and modifications are intended to be included within the scope of the disclosure as defined by the appended claims.

List of Reference Symbols
 1 Shaft
 2 Turntable
 3 Workpiece holder
 4 Axle journal
 5 Workpiece
 6 Drive wheel
 7 Tooth
 8 Driving device
 9 Rotating ring
 10 Ring retainer
 11 Extension
 12 Peg
 13 Fastening ring
 14 Fastening screw
 15 Setscrew
 16 Driver finger
 17 Recess
 18 Rod

What is claimed is:

1. A workpiece support for a coating unit, comprising:
 a) a base;
 b) at least one drivable shaft rotatably connected to the base so as to be rotatable about a main axis of rotation, the shaft defining an axial direction;
 c) a plurality of turntables nonrotatably mounted to the shaft, the turntables spaced an adjustable distance apart in the axial direction of the shaft;
 d) at least one workpiece holder which is rotatably mounted on each turntable so as to be rotatable about an axis of rotation which is parallel to the main axis of rotation;
 e) at least one driving device, each driving device including a driver, wherein the driving device is mounted to the turntable so as to be rotatable about the main axis of rotation and non-displaceable in the axial direction of the shaft, wherein the driver of each driving device is coordinated with one turntable so that the driver engages at least intermittently with one workpiece holder to cause the workpiece holder to rotate about its axis of rotation; and
 f) a stop which is anchored to the base, wherein the stop cooperates with a portion of each driving device to limit the rotation of each driving device.

2. A workpiece support according to claim 1, wherein the driver engages a side of the at least one workpiece holder that faces away in each case from the main axis of rotation.

3. A workpiece support according to claim 1, wherein the position of the driver relative to the workpiece holders is adjustable.

4. A workpiece support according to claim 1, wherein the stop is formed by a rod that extends parallel to the shaft, and wherein each driving device has an extension that projects beyond an edge of the respective turntable which is sized for cooperative engagement with a portion of the rod.

5. A workpiece support according to claim 4, wherein the extension has a bay-like recess which receives the rod.

6. A workpiece support according to claim 1, wherein the driving device is mounted in each case on the underside of the turntable.

7. A workpiece support according to claim 6, wherein the driving device includes a rotating ring coaxial with the turntable.

8. A workpiece support according to claim 7, wherein, on the underside of the turntable, a ring retainer is fastened inside the rotating ring and grips under said rotating ring.

9. A workpiece support according to claim 1, wherein the driver of at least one turntable intermittently engages the at least one workpiece holder.

10. A workpiece support according to claim 9, wherein the driver, in the form of a driver finger, is directed towards an edge of the turntable.

11. A workpiece support according to claim 10, wherein the driver finger rests on a fastening ring which is fastened by means of a fastening screw to a peg that extends substantially parallel to the shaft.

12. A workpiece support according to claim 11, wherein the driver finger is mounted so as to be longitudinally displaceable on the fastening ring and can be fixed by means of a setscrew.

13. A workpiece support according to claim 1, wherein the driver of at least one turntable continuously engages the at least one workpiece holder.

14. A workpiece support according to claim 13, wherein the driver is in the form of a driver ring having an inner tooth system, in particular in the form of a cylindrical metal sheet having a tooth profile.

15. A workpiece support according to claim 1, wherein at least one predetermined breaking point is provided on at least one turntable, at which predetermined breaking point the force transmission between the shaft and the turntable or between the stop and the at least one workpiece holder via the driving device is interrupted in the event of overload.

16. A workpiece support according to claim 1, wherein at least one turntable has a driver that intermittently engages the at least one workpiece holder, and at least one other turntable has a driver that continuously engages the at least one workpiece holder.

* * * * *